(12) United States Patent
Kiesewetter et al.

(10) Patent No.: US 6,218,944 B1
(45) Date of Patent: Apr. 17, 2001

(54) LABEL FOR MARKING AND REMOTE DETECTION OF OBJECTS

(76) Inventors: Lothar Kiesewetter, Goethestrasse 3, D-03046 Cottbus; Harald Zillessen, Karlstrasse 51, D-03044 Cottbus, both of (DE); Carl Tyren, 12 Boulevard Albert Ler, F 06600 Antibes (FR)

( * ) Notice: Subject to any disclaimer, the term of this patent is extended or adjusted under 35 U.S.C. 154(b) by 0 days.

(21) Appl. No.: 09/194,309

(22) PCT Filed: May 30, 1997

(86) PCT No.: PCT/SE97/00949

§ 371 Date: Sep. 17, 1999

§ 102(e) Date: Sep. 17, 1999

(87) PCT Pub. No.: WO97/45820

PCT Pub. Date: Dec. 4, 1997

(30) Foreign Application Priority Data

May 31, 1996 (SE) .................................................... 9602184

(51) Int. Cl.⁷ .................................................... G08B 13/14
(52) U.S. Cl. ..................... 340/572.6; 340/551; 340/742; 340/257
(58) Field of Search .................................... 340/572, 551, 340/742, 257

(56) References Cited

U.S. PATENT DOCUMENTS

| 4,510,490 | * | 4/1985 | Anderson, III et al. | 340/572 |
| 4,622,543 | | 11/1986 | Anderson, III et al. | 340/572 |
| 4,647,917 | * | 3/1987 | Anderson, III et al. | 340/572 |
| 5,001,458 | * | 3/1991 | Tyren et al. | 340/551 |
| 5,175,419 | * | 12/1992 | Yamashita | 235/449 |
| 5,420,569 | | 5/1995 | Dames et al. | 340/572 |
| 5,854,589 | * | 12/1998 | How et al. | 340/551 |

* cited by examiner

*Primary Examiner*—Daniel J. Wu
*Assistant Examiner*—Tai T. Nguyen
(74) *Attorney, Agent, or Firm*—James Ray & Associates

(57) ABSTRACT

A label for marking and remote detection of objects has a capsular housing (10, 11) of a material, which in non-magnetic, electrically non-conductive as well as resistant against external influence, the housing consisting of a lower portion (10) and a cover (11), between which a cavity (12) is formed, and at least one elongated sensor element (13) arranged in the cavity (12), the sensor element being made from an amorphous magneto-elastic material with high magneto-mechanical coupling. On all its interior surfaces facing the cavity (12), the housing (10, 11) is provided with fine bristles or fibers (14), the number, length and density of which have been selected for receiving the sensor element (13) in a way, such that the sensor element (13) when resonating, will maintain its straightness and will be allowed to oscillate in the longitudinal direction thereof essentially free from losses, with no harmful influence from bending or torsional forces, and with no risk of losing energy due to friction or contact with the inside of the housing (10, 11).

15 Claims, 2 Drawing Sheets

LABEL FOR MARKING AND REMOTE DETECTION OF OBJECTS

TECHNICAL FIELD

The present invention relates to a label for marking and remote detection of objects, comprising a capsular housing of a material, which is non-magnetic, electrically non-conductive and resistant against external influences, the housing comprising a lower portion and a cover, between which a cavity is formed, and at least one elongated sensor element, which is arranged in the cavity and consists of amorphous magneto-elastical material with high magneto-mechanical coupling.

DESCRIPTION OF THE PRIOR ART

Labels of the kind described above are disclosed in for instance the European patent publications EP-A2-0 093 281 and EP-A2-0 096 182, in the American patent publication U.S. Pat. No. 4,647,917, in the international patent publication WO88/01427 and in the published Swedish patent application 9402943-6. According to these publications the labels are provided with an internal space, in which one sensor element or a plurality of sensor elements is/are arranged.

Each sensor element has the shape of a ribbon, a strip or a wire and consists of an amorphous metal alloy with specific compositions, which give the sensor element magneto-elastical properties with high magneto-mechanical coupling. Through its magneto-mechanical coupling a sensor element may be forced into mechanical resonance by supplying magnetic energy thereto, for instance as an interrogation or interference signal. The sensor element will oscillate in its longitudinal direction, and this longitudinal resonance may be detected by means of a suitable magnetic detection means, such as a coil.

Furthermore, each label is often provided with several sensor elements as described above. By designing the sensor elements of a label in a way, such that the resonant frequency of each sensor element lies within a unique frequency band, the resonant frequencies of all sensor elements present in a label may be simultaneously detected. By arranging the sensor elements of each label in given relationships with respect to each other, a code for identifying the label, and hence also for identifying the object to which the label is attached, may be obtained. According to an encoding procedure the angles between the sensor elements of the label are used for defining a code value, and consequently any given code value may be obtained within a predetermined number range by varying the angles.

In WO88/01427 a method is disclosed for simultaneous detection of several identical labels or sensors in a detection zone. For this purpose a magnetic bias or control field is used, which is heterogeneous inside the detection zone as regards the direction and/or strength thereof. The resonant frequencies of the sensor elements are strongly influenced by the surrounding magnetic field, and thanks to the varying magnetic bias field such sensor elements may be simultaneously detected, which are identical but which are located at different positions within the detection zone and are thus exposed to magnetic fields of different strength or direction.

It is very important for labels of the kind described above that the longitudinal resonance oscillations of the sensor element may occur with a minimum amount of disturbance from the environment. Common sources of disturbance are for instance the inevitable gravity force, limited freedom of movement due to the suspension or mounting of the sensor element in the label, frictional losses due to contact between the sensor element and the surrounding walls of the internal space of the label, etc. To be as useful as possible in sensor applications the sensor element should in principal exhibit a fully uniform oscillation, which completely lacks directional dependence. In an ideal situation this can be regarded as a sensor element freely floating in vacuum, but this is impossible to realize in a real situation, obviously enough.

Previously known methods for housing the sensor elements in their labels suffer, among other things, from the following considerable disturbances and defects:

A sensor element which is lying flat or standing from a longitudinal side will be restricted, in terms of its resonance oscillation, by frictional forces due to the weight of the element as well as the frictional properties as regards the contact surface to the label.

If the sensor element is arranged standing from a short side, the oscillating movements of the element will be transmitted into surrounding parts of the label, thereby causing a fifty per cent decrease of the resonant frequency of the element or causing intermittent oscillation modes.

A sensor element, which for some reason is too bended or twisted, will cause a considerable reduction of the longitudinal oscillation amplitude.

For physical reasons it would be highly recommendable to mount the sensor element at the center point thereof. However, for manufacturing reasons it has proven difficult to locate this center point exactly, and even very small deviations from a correct center point will lead to beats in the resonance oscillations. Considerable manufacturing costs are required in order to obtain a sufficiently precise center point mounting. Furthermore, the ends of the ribbon may be bended due to the gravity field of the earth.

As an alternative, if the sensor element is supported at its ends, which would be reasonable from a physical point of view, a non-negligible risk of bending due to the gravity and the element weight exists in this situation too.

If the sensor element is mounted or supported at other points than the ones described above, undesired disturbances will be present in the resonance oscillations of the element.

In the Swedish patent application No. 9402943-6 previously filed by the present applicant a label design is disclosed, where the risk has been reduced for harmful influence on the sensor elements contained in the label from for instance the surrounding gravity field. The sensor elements have been given a non-planar sectional shape, said shape enabling the elements to maintain their straightness in a better way. However, at least one mounting point is still required for each sensor element, thereby causing problems as described above. Furthermore, a non-planar sectional shape is disadvantageous in that the external height of the label becomes larger, since the sensor elements require more space in the vertical direction inside the label, and in that the sensor elements are difficult—and consequently expensive—to produce.

EP-A2-0 093 281 and EP-A2-0 096 182 suggest to place the sensor elements between two pieces of fabric, said pieces of fabric in turn being contained in a wrapping of polymeric film. Such a label has the advantage of a small size, but on the other hand the label has a poor protection against external influences due to its softness.

EP-A1-0 704 828 suggests the possibility of placing a magneto-elastical or magneto-strictive sensor element in a corresponding cavity, which is formed as an integrated portion of the apparatus housing of for instance a clock radio. Alternatively, the sensor element may be placed in a cavity in a packing made of carton or the like for the goods. Accordingly, the sensor element will be relatively well protected against external forces, but the internal forces—due to the friction—in the cavity may severely reduce the sensor function of the element. In addition this solution does not seem cost efficient.

SUMMARY OF THE INVENTION

It is an object of the present invention to remedy the problems described above and provide a label, in which the sensor element or sensor elements is/are arranged or stored in the label with minimum damping and risk of interference and in which the sensor element will be given a good protection against external mechanic influences thanks to the design of the label. Furthermore, the label shall be very simple and inexpensive to massproduce and must not interfere with the magnetic flux therethrough.

In particular the present invention aims at providing a label, where twisting or bending of the sensor element is prevented, where the need for a fix mounting or storing of the element has been elimininated, where the friction between the surfaces of the sensor element and the opposite internal surfaces inside the label is minimal, where the longitudinal resonance oscillations of the sensor element only to the lowest possible extent are transferred to surrounding parts of the label, and where the magnetic properties of the sensor element are not influenced by the label design.

The objects and purposes described above are achieved by a label according to the invention with features as defined in the appended patent claims.

BRIEF DESCRIPTION OF THE DRAWINGS

The invention will now be described in the following, reference being made to the accompanying drawings, in which.

DETAILED DESCRIPTION OF EMBODIMENTS

Figure 1:
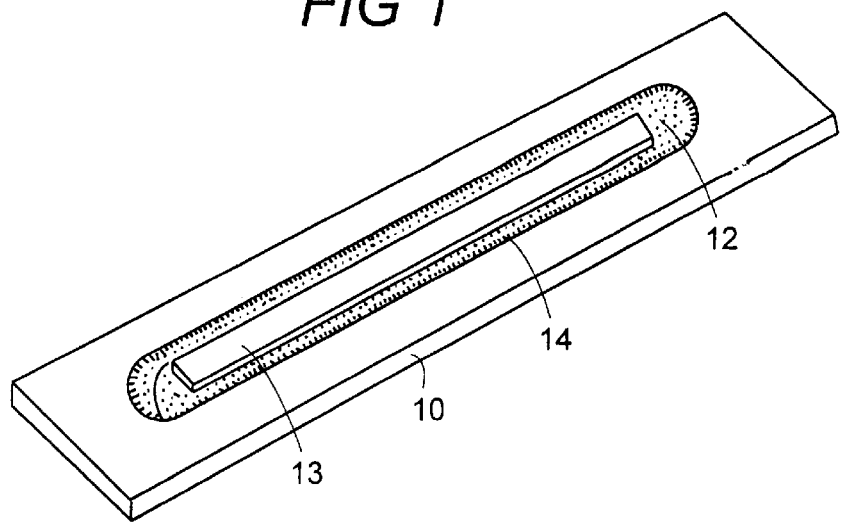
FIG. 1 is an enlarged perspective view of a label according to a preferred embodiment of the invention, where the cover of the label has been removed so as to better illustrate the internal portion of the label.
Figure 2:
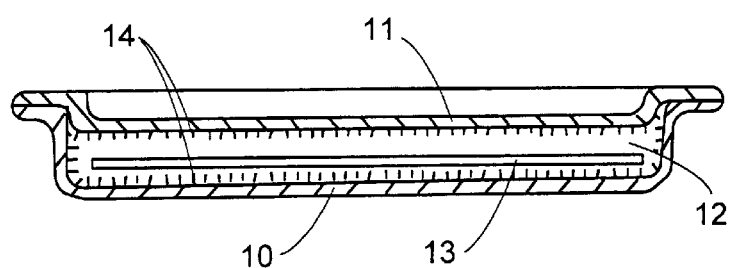
FIG. 2 is a cross-sectional view of the label according to the preferred embodiment of the invention.

A label acccording to a preferred embodiment of the invention comprises a housing with a lower portion 10 and an upper portion or cover 11, both of which are preferably made from plastics or similar material, which lacks magnetic properties and which may be massproduced at a low cost, as disclosed in FIGS. 1 and 2. The label is arranged to be attached to the intended object—such as a shop article, a piece of furniture or a piece of clothing—by for instance gluing, mounting or sewing. A cavity 12 is formed in the internal portion of the label housing 10, 11 by a longitudinal recess in the lower portion 10. On the inside of the cover 11 a corresponding protruding portion is formed, which follows the recess in the lower portion 10. A space is formed between the recess and the protruding portion, the volume of which is large enough for receiving and housing a sensor element 13, as described below.

The sensor element 13 is formed as an elongated ribbon of amorphous magneto-elastical material with high magneto-mechanical coupling and corresponds, in all essential aspects, with the sensor elements according to the prior art described above, and hence the sensor element will not be further described herein.

Figure 3:
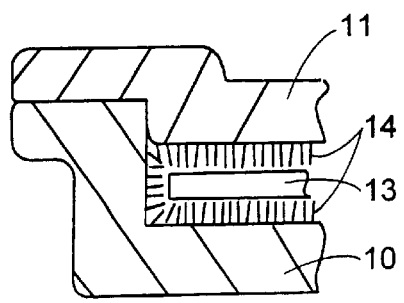
FIG. 3 is an enlarged detail view of a portion of the label according to the preferred embodiment of the invention.

The housing 10, 11 is, on all its internal surfaces facing the cavity 12, provided with fine bristles or fibres 14, which extend perpendicularly from the internal walls of the cavity and which are made of for instance plastic material. Between these bristles or fibres a flat elongated space is formed, in which the magneto-elastical sensor element 13 is loosely arranged. The size of this space has been carefully selected so as to precisely receive the sensor element 13, and hence the need has been eliminated for a fix mounting or storing of the element. It is to be noted that the dimensions of the space has been exaggerated for illustrating purposes, in the vertical direction in particular. In reality the space is only slightly larger than the sensor element, wherein an exact fitting of the sensor element 13 and the surrounding bristles or fibres 14 is achieved. The fitting appears more clearly from FIG. 3, which is a detailed and enlarged view of a portion of a label according to the preferred embodiment of the invention. The same reference numerals have been used in FIG. 3 and in the previous drawings, and they are thus not repeated here. Hence, the sensor element 13 rests loosely on the bristles or fibres 14. Thanks to the lack of a fix mounting point the problems described above with bending due to the gravity and the weight of the element may be avoided.

The bristles or fibres 14 has a bending elasticity, which is sufficient to support a longitudinally oscillating sensor element 13 during the resonance thereof essentially without damping the oscillation, and at the same time the bristles are stiff enough in the axial direction thereof, so that the oscillating sensor element will not reach contact with the hard internal surfaces of the label, the longitudinal resonance energy thereby being prevented from being transferred to the label. Thanks to the design and location of the bristles or fibres an extremely small damping in all directions is guaranteed, the sensor element at the same time being protected from tough external impacts, etc, in the oscillation mode, since the bristles or fibres act as shock absorbing means.

The cover 11 is mounted on and fixed to the lower portion 10 at an appropriate time during the manufacturing, for instance by gluing or clamping.

Hence, a label as described above provides a substantially dampingless storing of the sensor element 13, as regards its longitudinal oscillations at resonance. At the same time the harmful influence of the sensor element 13 due to the twisting or bending thereof is prevented, which previously known labels are exposed to. Furthermore the sensor element is well protected against dirt, dust and moisture.

According to an alternative embodiment of the present invention the housing is provided with a plurality of cavities and corresponding sets of elastical bristles or fibres in correspondence with the description above. Each cavity is arranged to receive a respective magneto-elastical sensor element, and by adjusting the lengths and the masses of the respective sensor element, a code for identifying the label may be achieved, similar to the one described in the Swedish patent application No. 9402943-6.

Figure 4:
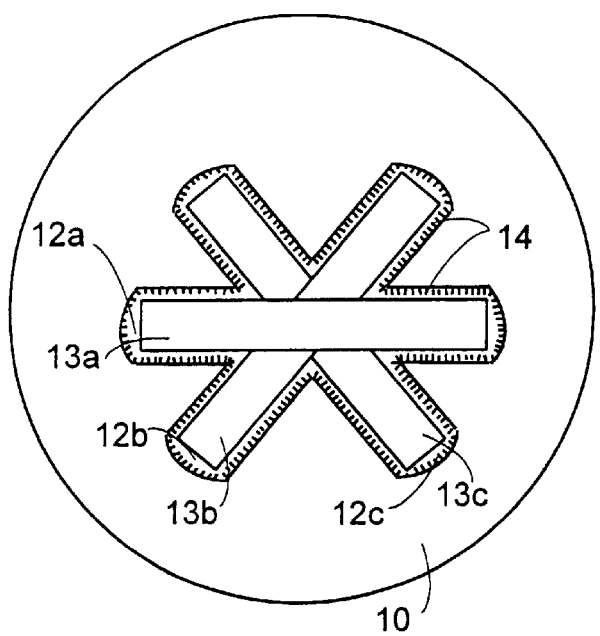
FIG. 4 is a schematic top view of a label according to an alternative embodiment of the invention.

In FIG. 4 a label according to the alternative embodiment mentioned above is schematically illustrated. A plurality (here: three) of cavities 12a, 12b, 12c are formed as elongated recesses in for instance a circular lower housing portion 10 according to a star configuration. In analogy with the above an upper housing portion (not disclosed) is provided on its inside with corresponding protruding portions. A sensor element 13a, 13b and 13c, respectively, is arranged in each of the cavities 12a–c. The walls of the cavities 12a–c are, as described above, provided with fine bristles or fibres 14 for close reception of the respective sensor element. Also the protruding parts of the upper portion are provided with such bristles or fibres 14.

Thanks to the star configuration of the elements as described above no intermediate elements are required between the respective sensor elements 13a–c, since the longitudinal motions of an oscillating sensor element are minimal at the center of the element (even if the tension reaches maximum in this point). Consequently, the cavities 12a–c and the sensor elements 13a–c may be arranged in substantially the same horizontal plane, thereby allowing a minimal label height. For further information the description above of the preferred embodiment of the invention is referred to.

Figure 5:
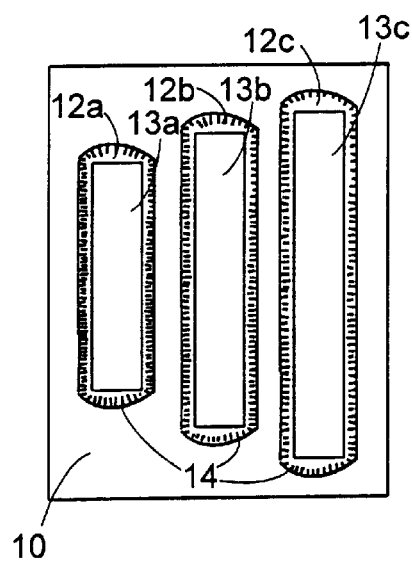
FIG. 5 is a schematic top view of a label according to yet another embodiment of the invention.

In FIG. 5 a label according to yet another alternative embodiment of the invention is schematically illustrated. In this case the lower housing portion 10 is preferably rectangular. A plurality—in this case three—of cavities 12a–c are formed between recesses in the lower portion 10 and corresponding protruding parts on the inside of an upper housing portion not disclosed in the drawing. The walls of the cavities 12a–c are in analogy with the above provided with fine bristles or fibres 14 for close reception of a sensor element 13a–c arranged in the respective cavity 12a–c. The cavities, and thus also the sensor elements, are according to this alternative embodiment essentially parallel to each other. As appears from FIG. 5, the sensor elements 13a–c have different lengths and consequently also different resonant frequencies. The element arrangement according to this embodiment is thus an alternative to the angular code arrangement described above.

As an alternative to the above the recesses or cavities may be arranged in different horizontal planes and in predetermined angles with respect to each other. Furthermore, it is possible to establish an angular code according to the above by stapling several lower housing portions on top each other at a certain mutual angular displacement.

The description above of the preferred and alternative embodiments of the invention is only to be regarded as embodiment examples. In particular, the invention is not limited to the above-described choices of material, label designs or sensor element arrangements. Other embodiments are equally possible within the scope of the invention, as defined by the appended patent claims.

What is claimed is:

1. A label for marking and remote detection of objects, comprising:
    a capsular housing (10, 11) of a material, which is non-magnetic, electrically non-conductive and resistant against external influences, the housing comprising a lower portion (10) and a cover (11), between which a cavity (12) is formed, and
    at least one elongated sensor element (13) arranged in the cavity (12), the sensor element (13) consisting of an amorphous magneto-elastical material with high magneto-mechanical coupling
    characterized in that the housing (10, 11) is provided, on all its internal surfaces facing the cavity (12), with fine bristles or fibres (14), the number, lengths and density of which have been selected for receiving the sensor element (13) in a way, such that the sensor element will maintain its straightness during the resonance thereof and is allowed to oscillate substantially free from losses in the longitudinal direction, without any harmful influence from bending or torsional forces and with no risk or energy losses due to friction or contact with the insides of the housing (10, 11).

2. A label according to claim 1,
characterized in that the cavity (12) is formed as a longitudinal recess in the lower housing portion (10).

3. A label according to claim 2,
characterized in that the bristles or fibres (14) are arranged essentially perpendicularly to the internal surfaces of the housing (10, 11) facing the cavity (12).

4. A label according to claim 3,
characterized in that the housing (10, 11) is provided is provided with a plurality of cavities (12a, 12b, 12c) for receiving a respective sensor element (13a, 13b, 13c).

5. A label according to claim 4,
characterized in that the cavities (12a, 12b, 12c) and the sensor elements (13a, 13b, 13c) are arranged in a star configuration in essentially the same horizontal plane in the label.

6. A label according to claim 2,
characterized in that the bristles or fibers (14) consist of plastics or another synthetic material.

7. A label according to claim 2,
characterized in that the housing (10, 11) is provided with a plurality of cavities (12a, 12b, 12c) for receiving a respective sensor element (13a, 13b, 13c).

8. A label according to claim 7,
characterized in that the cavities (12a, 12b, 12c) and the sensor elements (13a, 13b, 13c) are arranged in a star configuration in essentially the same horizontal plane in the label.

9. A label according to claim 1,
characterized in that the bristles or fibres (14) are arranged essentially perpendicularly to the internal surfaces of the housing (10, 11) facing the cavity (12).

10. A label according to claim 9,
characterized in that the bristles or fibers (14) consist of plastics or another synthetic material.

11. A label according to claim 9,
characterized in that the housing (10, 11) is provided with a plurality of cavities (12a, 12b, 12c) for receiving a respective sensor element (13a, 13b, 13c).

12. A label according to claim 11,
characterized in that the cavities (12a, 12b, 12c) and the sensor elements (13a, 13b, 13c) are arranged in a star configuration in essentially the same horizontal plane in the label.

13. A label according to claim 1,
characterized in that the bristles or fibers (14) consist of plastics or another synthetic material.

14. A label according to claim 1,
characterized in that the housing (10, 11) is provided with a plurality of cavities (12a, 12b, 12c) for receiving a respective sensor element (13a, 13b, 13c).

15. A label according to claim 14,
characterized in that the cavities (12a, 12b, 12c) and the sensor elements (13a, 13b, 13c) are arranged in a star configuration in essentially the same horizontal plane in the label.

* * * * *